Jan. 6, 1970 E. W. ROGERS 3,488,603
MULTISTAGE WIDE BAND TRANSISTOR AMPLIFIERS
OF THE PUSH-PULL TYPE
Filed Oct. 30, 1967
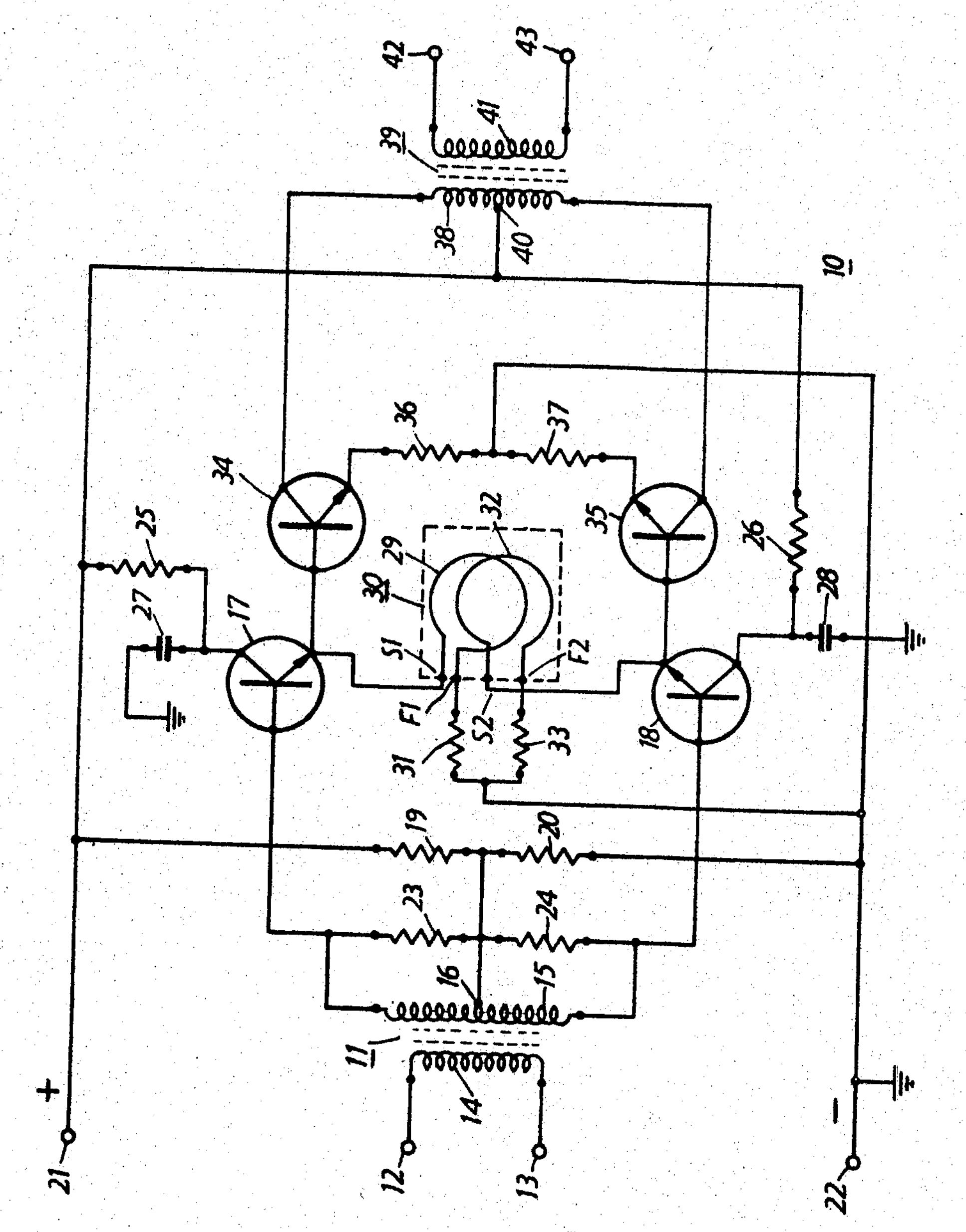

United States Patent Office 3,488,603
Patented Jan. 6, 1970

3,488,603
MULTISTAGE WIDE BAND TRANSISTOR AMPLIFIERS OF THE PUSH-PULL TYPE

Ernest William Rogers, Burstow, Horley, Surrey, England, assignor to Redifon Limited, London, England, a British company Filed Oct. 30, 1967, Ser. No. 678,899
Claims priority, application Great Britain, Feb. 1, 1967, 4,837/67
Int. Cl. H03f 3/26
U.S. Cl. 330—15 4 Claims

ABSTRACT OF THE DISCLOSURE

A two-stage, push-pull, radio-frequency, wide-band, transistor amplifier with the first stage transistor pair operating in class A and the second stage transistor pair operating in class B, in which the first and second stages are directly coupled and the output circuits of the first stage pair are inductively coupled together, so that both first stage transistors contribute to the drive of each second stage transistor.

This invention relates to transistor amplifiers and in particular to multistage transistor amplifiers of the push-pull type, capable of operating over a wide band of frequencies, in which the stages are coupled directly and by an inductive device in order to provide improved performance of the amplifier.

It is known to use a push-pull amplifier in which a pair of transistors, biased so as to operate under class A conditions, are coupled by way of a transformer to drive a further pair of transistors, biased so as to operate under class B conditions. It is also known to use a push-pull amplifier in which a pair of transistors, biased so as to operate under class B conditions, are directly coupled to drive a further pair of transistors, biased so as to operate under class B conditions.

In the transformer coupled arrangement, difficulty is experienced in providing a driver transformer for the class B stage, having a sufficiently low leakage reactance to achieve efficient transfer of power over a wide range of frequencies with low distortion. Where high frequencies are to be amplified, the use of negtaive feedback to improve the efficiency of transfer of power or to reduce distortion, may give rise to further difficulties, for example, instabilities at certain frequencies in the transmitted band.

In circuits in which the frequencies to be transmitted are high, the physical size of the transformer may be such that the connecting leads to and from it cannot be made sufficiently short without introducing unwanted series reactances. Furthermore, in the transformer coupled arrangement, in order that the class B stage may be operated efficiently, it is necessary that the bias for the stage should be provided from a source of low impedance. This is usually provided by a potentiometer network, hence, an appreciable amount of D.C. power is wastefully dissipated in the resistors of the network. In the directly coupled arrangement, where the transistors of both stages are operated under class B conditions and the emitter electrodes of a first stage are directly coupled to the base electrodes of a second stage, it is possible to effect an economy in the consumption of current drawn from the D.C. supply, by deriving the bias for the second stage from resistors connected in series with the transistors of the first stage. This method of deriving bias has the advantage that the bias voltages are stabilised by the presence of the transistors of the first stage.

An appreciable amount of distortion is present at low levels of signal input, due to the intermittent action of the transistors of the first stage when they are operated under class B conditions. This distortion may be reduced by arranging that the transistors of the first stage are operated under class A conditions, so that the output impedance of the transistors of the first stage is reduced and intermittent action is avoided. However, in order to provide correct biasing of the second stage, the biasing resistors must be of such low value that there is wasteful dissipation of signal frequency power in them.

It is an object of the present invention to provide an interstage coupling arrangement for a two stage push-pull amplifier, in which the second stage is operated under class B conditions, whereby efficient amplification is provided over a wide range of frequencies and distortion is maintained at a low level, without the use of negative feedback.

Accordingly, the present invention provides a multistage amplifier for electric wave signals having first and second branches for providing push-pull operation of the amplifier, comprising in cascade a first stage of at least two transistors operating under class A conditions, and a second stage of at least two transistors operating under class B conditions, an electrode of the transistor in the first branch of the first stage being connected directly to an electrode of the transistor in the first branch of the second stage and to one winding of an inductive device having at least two windings, an electrode of the transistor in the second branch of the first stage being connected directly to an electrode of the transistor in the second branch of the second stage and to the other winding of the inductive device, the two windings of the said inductive device being connected in a sense such that power for driving a transistor of the second stage is provided by the transistor of the first stage to which it is directly connected and in part by the other transistor of the first stage, by way of the said inductive device. Thereby the efficiency of the amplifier is improved and distortion for a given output power is reduced.

In order that the invention may be readily carried into practice, an embodiment thereof will now be described in detail, by way of example, with reference to the accompanying drawing, the sole figure of which is a schematic circuit diagram of a multistage, transistor, push-pull amplifier.

Briefly, the circuit of the amplifier to be described in detail in this specification has two stages, each of which comprises a pair of transistors connected in a push-pull circuit arrangement. Each transistor of the pair of transistors forming the first stage is connected in an emitter-follower configuration and each transistor of the pair of transistors forming the second stage is connected in a common emitter configuration. The transistors of the first stage are biased so as to operate under class A conditions and the transistors of the second stage are biased so as to operate under class B conditions. The transistors of the amplifier are of similar conductivity type, that is to say, all of n-p-n or all of p-n-p type. In the embodiment of the invention to be described in detail later in this specification, n-p-n transistors are used.

The emitter electrode of one of the transistors of the first stage is directly coupled to the base electrode of one of the transistors of the second stage and is connected to one winding of two tightly coupled windings of an inductive device. The emitter electrode of the other transistor of the first stage is directly coupled to the base electrode of the other transistor of the second stage and is connected to the other winding of the inductive device. The two windings are connected to two resistors which provide a conductive path for the emitter currents of the transistors of the first stage and bias voltages for the base electrodes of the transistors of the second stage.

Therefore, by arranging that the windings of the inductive device are connected in the circuit in an appropriate sense, power for driving a transistor of the second stage, in the period of time during which it is operative, is provided not only by the transistor of the first stage to which it is directly coupled but in part by the other transistor of the first stage, therefore more power is available for driving the transistors of the second class B stage, so that the efficiency of the amplifier is improved. Furthermore, because of the sharing of the load by the transistors of the first stage, regulation is improved and distortion, due to the effect of the intermittent load imposed by each transistor of the second stage, is reduced.

An impedance corresponding to the reflected input impedance of the operative transistor of the second stage is presented alternately by way of the inductive device, to the transistors of the first stage. The value of this impedance is high with respect to that of an emitter resistor of the first stage, hence, the amount of signal power dissipated in the emitter resistors is relatively small.

Referring to the figure, an amplifier of the kind referred to, which is indicated generally in the drawing by the reference number 10, is fed with an input signal, having a frequency in the band from two to twelve megacycles per second, by way of a transformer 11, from a source of radio frequency signals, not shown in the drawing, connected to terminals 12 and 13.

The transformer 11 has a primary winding 14, which is connected to the terminals 12 and 13 of the signal source, and a secondary winding 15, by which a push-pull signal output is provided with respect to a centre-tap 16 of the secondary winding.

The ends of the secondary winding are connected to the base electrodes of first and second transistors, 17 and 18, respectively, of a pair of transistors forming the first push-pull stage of the amplifier. The transistors 17 and 18 are of n-p-n type and are connected in an emitter-follower configuration.

A bias voltage of positive polarity, with respect to chassis, is provided for the transistors 17 and 18 by connecting the centre-tap 16 to the junction point of a potentiometer network comprising two series connected resistors 19 and 20. The resistors 19 and 20 are connected to terminals 21 and 22 respectively, which form the positive and negative poles respectively of a source of supply of direct current, which is not shown in the drawing. The source of supply is designed so as to offer negligible impedance to alternating currents of the signal frequency of the amplifier. Terminal 22 of the source of supply is connected to chassis. The resistors 19 and 20 are of a value such that the transistors 17 and 18 are operated under class A conditions. A resistor 23 is connected across one half of the secondary winding 15 of the transformer and a resistor 24 is connected across the other half of the secondary winding, in order to provide a substantially constant load on the transformer irrespective of changes in the input impedance of the transistors 17 and 18.

The collector electrodes of the transistors 17 and 18 are connected to the terminal 21 of the source of supply of direct current by way of decoupling resistors 25 and 26 respectively. Alternating currents of signal frequency are bypassed to chassis by capacitors 27 and 28, connected respectively to the collector electrodes of the transistors 17 and 18.

The emitter electrode of the transistor 17 is joined to chassis by way of a first winding 29 of an inductive device 30 and by way of a resistor 31. The emitter electrode of the transistor 18 is joined to chassis by way of a second winding 32 of the inductive device 30 and by way of a resistor 33. The emitter electrode of the transistor 17 is directly connected to the base electrode of a first transistor 34 of a pair of transistors 34 and 35 forming a second push-pull stage of the amplifier. The emitter electrode of the transistor 18 is directly connected to the base electrode of the transistor 35. The transistors 34 and 35 are of n-p-n type and are connected in a common emitter configuration.

The inductive device 30, by which energy is transferred from one branch to the other branch of the amplifier comprises the two windings 29 and 32, wound in the same direction on a core of small physical dimensions, with the turns in intimate contact, to provide the tightest possible magnetic coupling between the two windings. The desired reversal of phase is provided by connecting the start and finish of the winding 29, indicated in the drawing by S1 and F1, respectively, to the emitter electrode of the transistor 17 and to the resistor 31 respectively, and by connecting the start and finish of the winding 32, indicated in the figure by references S2 and F2 respectively, to the emitter electrode of the transistor 18 and to the resistor 33 respectively.

The direct connections between the emitter and base electrodes of the transistors 17 and 34 and between the emitter and base electrodes of the transistors 18 and 35, also the connections to and from the inductive device 30 are made as short as possible in order to reduce unwanted series reactances to a minimum.

As already described, the resistors 31 and 33 provide a conductive path for the emitter currents of the transistors 17 and 18 and bias voltages of a value such that the transistors 34 and 35 operate under class B conditions.

The emitter electrodes of the transistors 34 and 35 are connected to chassis by way of resistors 36 and 37 respectively, and the collector electrodes of the transistors 34 and 35 are connected to the ends of a primary winding 38 of a push-pull output transformer 39.

The primary winding 38 is provided with a centre tap 40, which is connected to the terminal 21, so that current is supplied to the collector electrodes of the transistors 34 and 35 by way of the primary winding of the transformer. The transistors 34 and 35 are connected in a common emitter configuration, hence, a small amount of current feedback is provided by the resistors 36 and 37, thereby raising the input impedance of the second stage of the amplifier and protecting the transistors 34 and 35 from damage due to thermal runaway.

The output transformer 39 has a secondary winding 41 connected to output terminals 42 and 43, from which power is supplied to a load connected thereto. The number of turns of the secondary winding 41 and the turns ratio may be chosen to match a wide range of external impedances forming either a balanced or unbalanced load.

The emitter resistors 31 and 33, providing bias for the transistors of the second stage may be replaced by a single resistor, also the emitter resistors 36 and 37 of the output stage transistors may be replaced by a single resistor. However, the arrangement using separate emitter resistors in a stage is preferred, since it is then unnecessary to select for that stage a pair of transistors having similar electrical characteristics.

By way of example only, type numbers and values are given for the circuit elements of the amplifier shown in the figure:

| | |
|---|---|
| Transformer **11** | Impedance ratio 50:100+100 ohms. Windings **14** and **15** respectively. |
| Transistors **17** and **18** | RCA 2N3553 type (n-p-n). |
| Resistor **19** | 470 ohms. |
| Resistor **20** | 56 ohms. |
| Resistors **23** and **24** | 120 ohms. |
| Resistors **25** and **26** | 30 ohms. |
| Capacitors **27** and **28** | 0.1 microfarad. |
| Transistors **34** and **35** | RCA 40341 type (n-p-n). |
| Inductive device **30** | Described in detail subsequently. |
| Resistors **31** and **33** | 3.3 ohms. |
| Resistors **36** and **37** | 0.5 ohms. |
| Transformer **39** | Impedance ratio 8+8:50 ohms. Windings **38** and **41** respectively. |
| D.C. source of supply | +24 volts (terminal **21**). |

In the example described, the inductive device 30 is of shell type construction, provided by a core of manganese-zinc ferrite, having dimensions of 7/16 inch x 7/16 inch x 3/16 inch. The two windings 29 and 32, each of one turn of 24 SWG enamel covered wire are wound with the turns in intimate contact, to provide close coupling, and in the same direction around the centre limb of the core. Each of the windings has an inductance of approximately 10 microhenries. A direct current of approximately 150 milliamps is passed from the emitter electrodes of the transistors 17 and 18 through each winding. Using an inductive device of this form, in the circuit arrangement already described and shown in the figure, it is possible to obtain efficient transfer of power from the first to the second stage of the amplifier over a range of frequencies from 200 kilocycles per second to 40 megacycles per second so as to provide a radio frequency power output into the load of 25 watts.

In an amplifier, suitable for amplification of audio fre-frequencies over the frequency range of 30 cycles per second to 30,000 cycles per second, the inductive device 30 is provided by an E-type of core of laminated nickel iron alloy, having approximate dimensions of 1½ inch x 1½ inch x 1½ inch and having two windings, each of 300 turns, the two windings being bifilar wound to provide tight coupling between them. The total inductance of each winding is approximately 100 millihenries.

What is claimed is:

1. A multistage amplifier for electric wave signals having first and second branches for providing push-pull operation of the amplifier, comprising in cascade a first stage of at least two transistors operating under class A conditions and a second stage of at least two transistors operating under class B conditions, the output electrode of a transistor in the first branch of the first stage being connected directly to the control electrode of a transistor in the first branch of the second stage and to one end of a first winding of an inductive device having at least two windings, the output electrode of a transistor in the second branch of the first stage being connected directly to the control electrode of a transistor in the second branch of the second stage and to one end of the second winding of the inductive device, the two windings of the said inductive device being coupled in a sense such that power for driving a transistor of the second stage is provided by the transistor of the first stage to which it is directly connected and in part by the other transistor of the first stage, by way of the said inductive device, the other end of said first and second windings being connected by way of a resistor to a common point, the two said resistors providing conductive paths for the output electrode currents of the first stage transistors and bias for the control electrodes of the second stage transistors.

2. A multistage amplifier as claimed in claim 1, in which the inductive device comprises a pair of tightly-coupled, radio-frequency coils.

3. A multistage amplifier as claimed in claim 2, in which the inductive device comprises two coils with corresponding turns wound in the same sense and side by side.

4. A multistage amplifier as claimed in claim 3, in which the transistors of said first and second stages are of the same conductivity type, and in which the output electrodes are emitter electrodes.

References Cited

UNITED STATES PATENTS

| | | | |
|---|---|---|---|
| 2,887,540 | 5/1959 | Aronson | 330—15 |
| 2,979,665 | 4/1961 | Schayes | 330—14 |

ROY LAKE, Primary Examiner

S. H. GRIMM, Assistant Examiner

U.S. Cl. X.R.

330—19, 20, 165, 182